(12) United States Patent
Cheng et al.

(10) Patent No.: US 9,145,895 B2
(45) Date of Patent: Sep. 29, 2015

(54) HEAT DISSIPATION FAN

(75) Inventors: Nien-Tien Cheng, New Taipei (TW); Chih-Jen Liu, New Taipei (TW)

(73) Assignee: Foxconn Technology Co., Ltd., New Taipei (TW)

( * ) Notice: Subject to any disclaimer, the term of this patent is extended or adjusted under 35 U.S.C. 154(b) by 494 days.

(21) Appl. No.: 13/559,616

(22) Filed: Jul. 27, 2012

(65) Prior Publication Data

US 2013/0105124 A1     May 2, 2013

(30) Foreign Application Priority Data

Oct. 31, 2011    (TW) .............................. 100139507 A

(51) Int. Cl.
| | | |
|---|---|---|
| *F04D 29/42* | (2006.01) | |
| *H01L 23/467* | (2006.01) | |
| *F04D 17/16* | (2006.01) | |
| *F04D 25/06* | (2006.01) | |

(52) U.S. Cl.
CPC ............ *F04D 17/16* (2013.01); *F04D 25/0613* (2013.01); *F04D 29/4206* (2013.01); *H01L 23/467* (2013.01); *H01L 2924/0002* (2013.01)

(58) Field of Classification Search
CPC ..... F01D 25/243; F01D 25/28; F04D 29/403; F04D 29/547; F04D 25/0613; F04D 29/4206; F04D 17/16
USPC .................... 415/213.1, 214.1, 220
See application file for complete search history.

(56) References Cited

U.S. PATENT DOCUMENTS

| 7,380,955 B2 * | 6/2008 | Lu et al. ........................ 362/96 |
| 2006/0099071 A1 * | 5/2006 | Kao et al. ..................... 415/206 |
| 2010/0092282 A1 * | 4/2010 | Hwang et al. ................ 415/206 |

\* cited by examiner

*Primary Examiner* — Dwayne J White
*Assistant Examiner* — Brian P Wolcott
(74) *Attorney, Agent, or Firm* — Novak Druce Connolly Bove + Quigg LLP

(57) ABSTRACT

An exemplary heat dissipation fan includes a housing and an impeller. The housing includes a casing. The casing includes a bottom wall and a side wall extending upwardly from the bottom wall. The impeller is received in the housing. The impeller includes a hub and a plurality of blades extending radially and outwardly from the hub. Each blade has a distal end facing the side wall of the casing. The inner side of the side wall depressed towards an outer side of the casing.

19 Claims, 7 Drawing Sheets

HEAT DISSIPATION FAN

BACKGROUND

1. Technical Field

The present disclosure relates to heat dissipation devices, and particularly to a heat dissipation fan.

2. Description of the Related Art

With the continuing development of electronics technology, electronic packages such as CPUs (central processing units) employed in electronic devices are generating more and more heat. The heat requires immediate dissipation in order that the CPU and the electronic device can continue to operate stably. A heat dissipation device such as a heat dissipation fan is commonly used in combination with a heat sink for cooling the CPU.

A conventional heat dissipation fan includes a housing and an impeller receiving in the housing. The impeller includes a plurality of blades. An inner sidewall of the housing is usually configured vertically and facing an end of each blades. The ends of the blades are usually configured vertically too. During operation of the heat dissipation device, the blades of the impeller rotate and drive air to evacuate heat from a fin assembly to the ambient environment through an air channel defined between the sidewall of the housing and the ends of the blades. However, a height of the sidewall of the housing is larger than that of the blades. An air pressure which is formed in an area of the air channel is stronger than that in other areas, thereby resulting in a non-uniform air pressure. Thus the rotation of the blades will generate a reverse involved airflow. When this happens, the impeller is said to be in a "floating" condition and is inclined to generate noise and lose energy, which may be annoying or even unacceptable.

What is desired, therefore, is a heat dissipation fan which can overcome the above-described shortcomings.

DETAILED DESCRIPTION

Reference will now be made to the figures to describe an embodiment of the present heat dissipation fan in detail.

Figure 1:
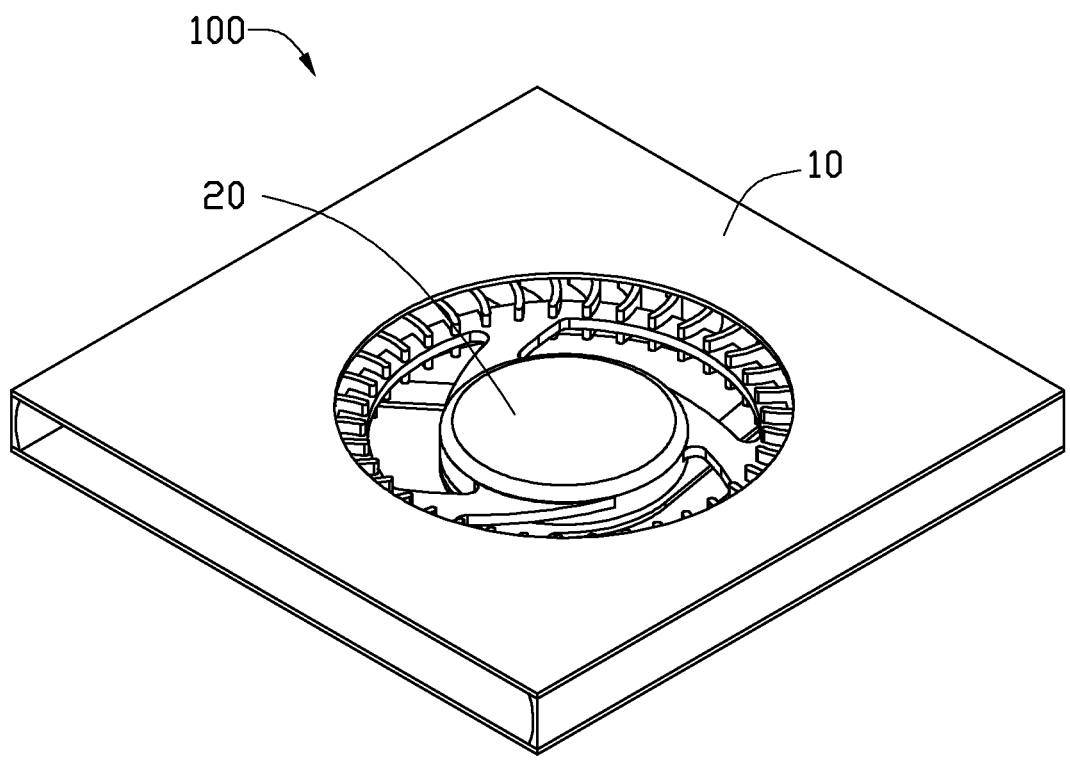
FIG. 1 is an isometric, assembled view of a heat dissipation fan according to a first exemplary embodiment of the present disclosure.
Figure 2:
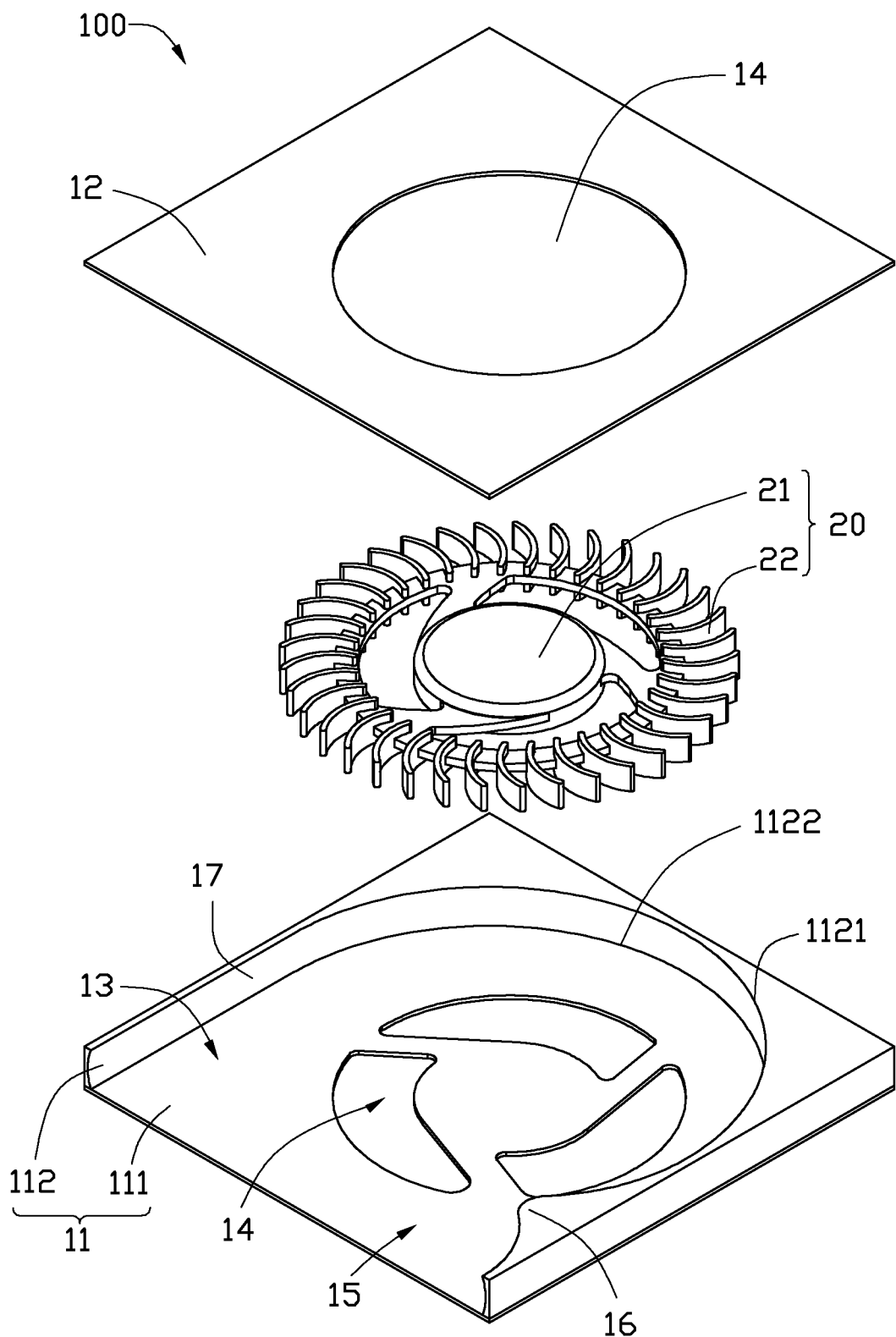
FIG. 2 is an exploded view of the heat dissipation fan of FIG. 1.

Referring to FIGS. 1-2, a heat dissipation fan 100 in accordance with a first exemplary embodiment is provided. The heat dissipation fan 100 includes a housing 10 and an impeller 20 rotatably received in the housing 10 for dissipating heat from heat generating electronic components.

The housing 10 is substantially a hollow rectangular frame, and includes a casing 11 and a top plate 12 covering the casing 11. A receiving space 13 is defined between the casing 11 and the top plate 12 for receiving the impeller 20.

The casing 11 includes a bottom wall 111 parallel to and spaced from the top plate 12, and a volute side wall 112 extending upwardly from the bottom wall 111 and connected between the top plate 12 and the bottom wall 111. The side wall 112 includes a bottom edge 1122 adjoining the bottom wall 111 and an upper edge 1121 away from the bottom edge 1122. The upper edge 1121 of the side wall 112 abuts to the top plate 12. Two air inlets 14 are defined in a central portion of the top plate 12 and bottom wall 111 respectively. An air outlet 15 with an opening direction perpendicular to that of the air inlet 14 is defined at a lateral side of the casing 11. A protruding portion 16 is formed on the side wall 112 and adjacent to the air outlet 15. The protruding portion 16 extends towards the receiving space 13. A groove 17 is defined by an inner surface of the side wall 112, adjacent to the receiving space 13. In this embodiment, the groove 17 is concave curved. In other word, the inner surface of the side wall 112 between the upper edge 1121 and the bottom edge 1122 is directed outwardly towards an outer side of the casing 11 and away from the receiving space 13, thereby forming the concave curved groove 17. A diameter of a middle portion of the side wall 112 is larger than that of the upper edge 1121 or the bottom edge 1122 of the side wall 112.

Figure 3:
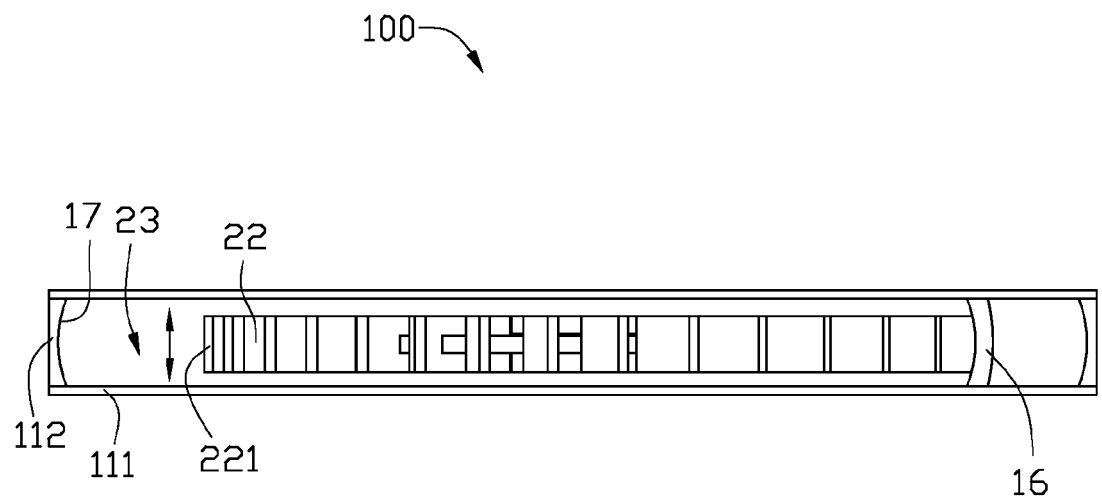
FIG. 3 is a lateral view at an air outlet of the heat dissipation fan of FIG. 1.

The impeller 20 is received in the receiving space 13 of the housing 10. The impeller 20 includes a hub 21, and a plurality of blades 22 extending radially and outwardly from an outer periphery of the hub 21. The hub 21 is directly facing the air inlets 14 of the top plate 12 and the bottom wall 111. Referring to FIG. 3, a vertical height of the blades 22 is smaller than that of the side wall 112 of the casing 11. Each blade 22 has a distal end 221 facing the side wall 112 of the casing 11. The distal end 221 of each blade 22 has an edge perpendicularly to the bottom wall 111 of the casing 11. An air channel 23 is defined between the distal ends 221 of the blades 22 and the side wall 112 of the casing 11 which are spaced from each other. Due to that the concave curved groove 17 is defined by the side wall 112, a distance between a middle portion of the side wall 112, i.e., bottom of the groove 17, and the distal end 221 of each blade 22 is larger than that between the upper edge 1121 or the bottom edge 1122 and the distal end 221 of each blade 22. Accordingly, the air channel 23 has an outer boundary convex outwards. As such, an air pressure difference along a vertical direction in the air channel 23 is decreased. The configuration of the air channel 23 can also reduce a variation of the air pressure when each blade 22 passes through the protruding portion 16. Thus, a vortex of airflow is reduced and a noise of blades at a frequency doubling point can be also reduced. Further, the configuration of the air channel 23 can increase an interior space for air, thereby enhancing a total air quantity thereof.

During operation of the heat dissipation fan 100, the impeller 20 is driven to rotate counterclockwise. Airflow is firstly driven from the air inlet 14 into the interior of the dissipation fan 100. Then, airflow is pressurized into the air channel 23 via the protruding portion 16. Finally, airflow flows out of the air outlet 15 along the groove 17 defined by the side wall 112 under a guiding of the air channel 23. A backflow of air which caused by parallel arranged blade edges and inner sidewall of casing or/and a height difference between the blades and the inner side wall of the casing can be avoided. Accordingly, the noise of the blades 22 and energy loss is reduced. Further, the total airflow is also increased and a heat dissipation efficiency thereof is improved.

Figure 4:
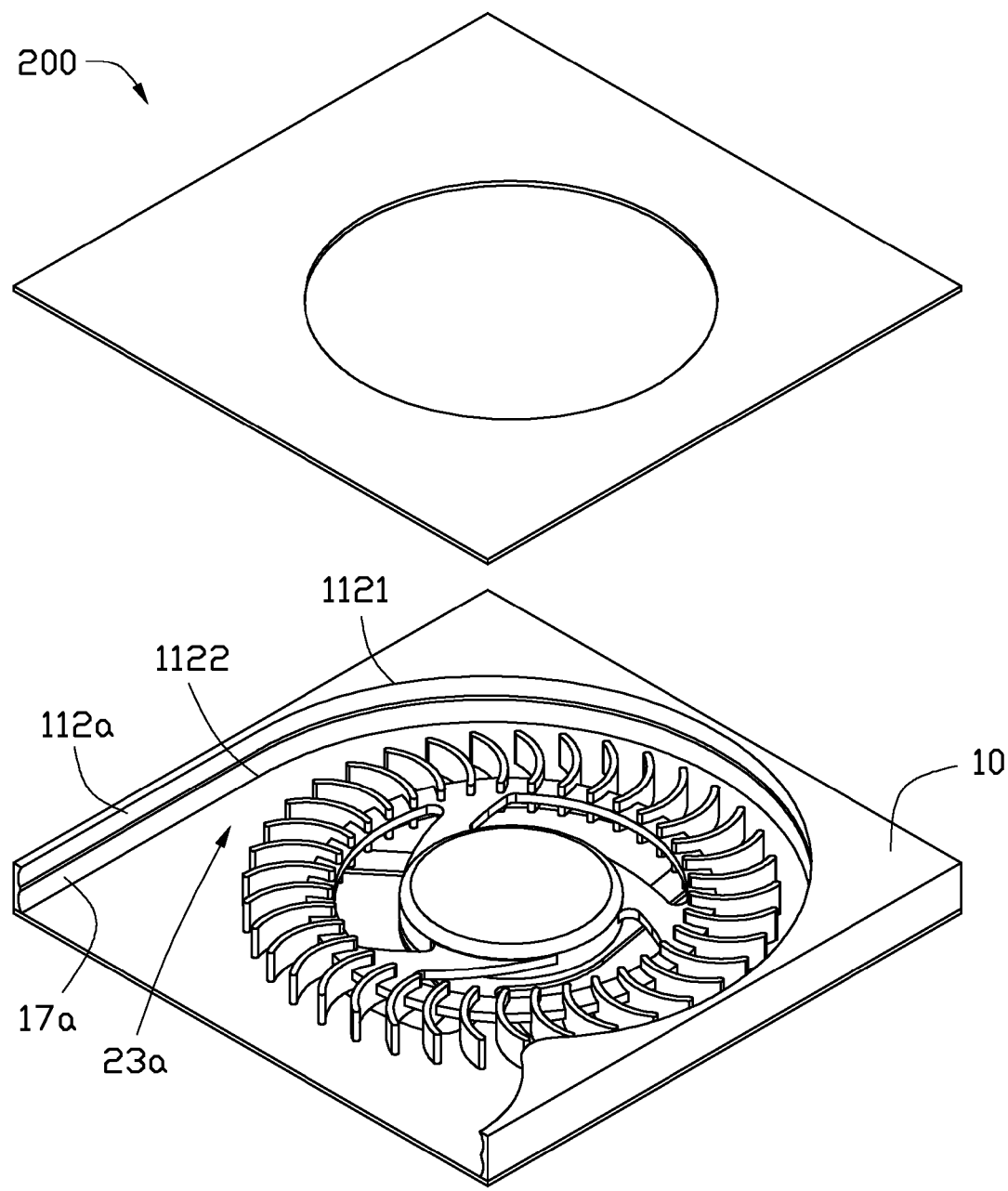
FIG. 4 is an exploded view of a heat dissipation fan according to a second exemplary embodiment of the present disclosure.
Figure 5:
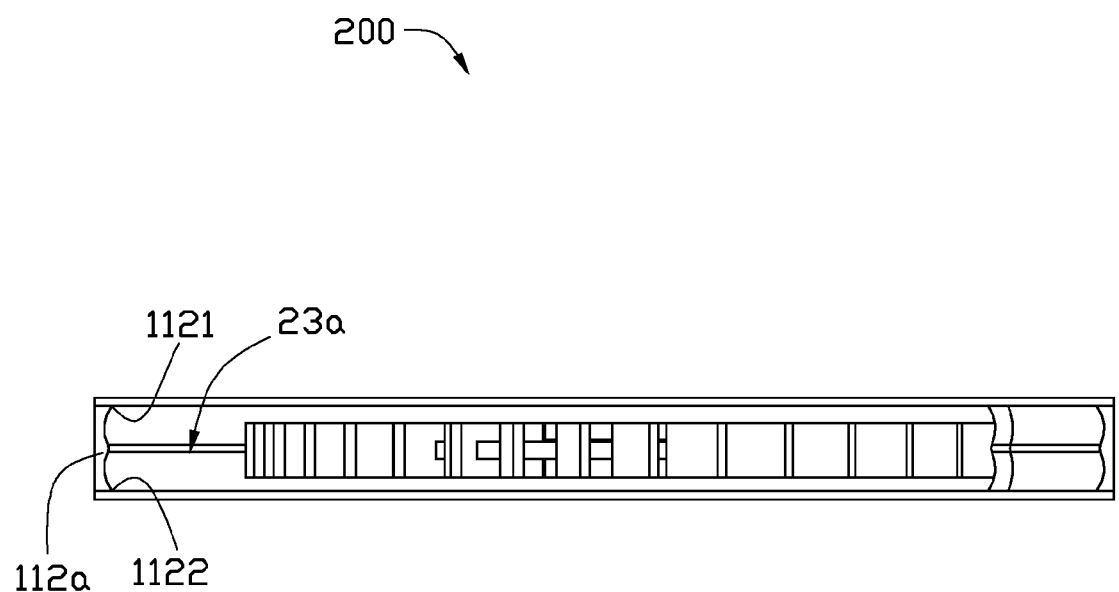
FIG. 5 is a lateral view at an air outlet of the heat dissipation fan of FIG. 4.

Referring to FIGS. 4-5, a heat dissipation fan 200 in accordance with a second exemplary embodiment is provided. The differences between the heat dissipation fan 200 of the second embodiment and the heat dissipation fan 100 of the first embodiment are described below. The number of the grooves 17a in the inner surface of the side wall 112a is different. In the second embodiment, there are two grooves 17a defined in the inner surface of the side wall 112a. A middle portion of the side wall 112a which has an equal distance to the upper edge 1121 and the bottom edge 1122 has a substantial same size along a radial direction as the upper edge 1121 and the bottom edge 1122. The inner surface 112a is directed outwardly towards the outer side of the housing 10, to define the two adjacent grooves 17a, approximately like a wave shape. The air channel 23a has an approximately wave-shaped outer boundary.

During operation of the heat dissipation fan 200, airflow in the heat dissipation fan 200 can be divided into two stratifications, thereby generating a stratified flow. In alterable embodiments, the number of the grooves can be changed.

Figure 6:
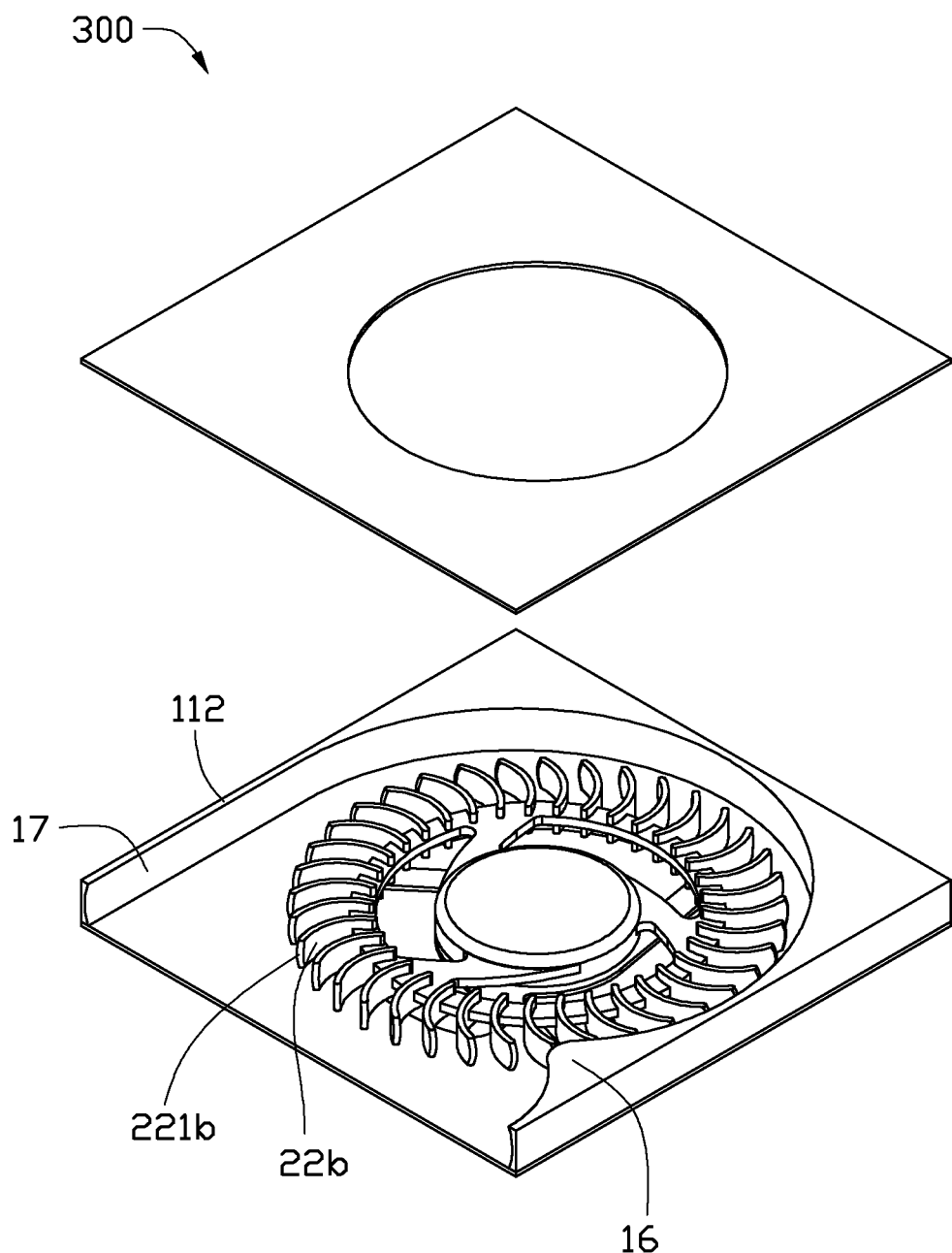
FIG. 6 is an exploded view of a heat dissipation fan according to a third exemplary embodiment of the present disclosure.
Figure 7:
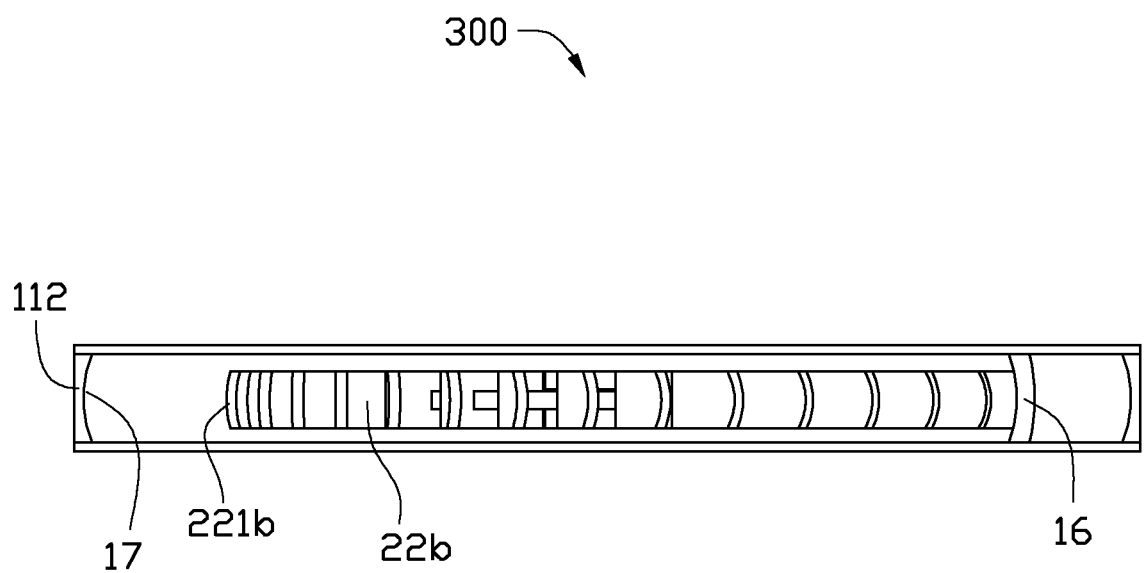
FIG. 7 is a lateral view at an air outlet of the heat dissipation fan of FIG. 6.

Referring to FIGS. 6-7, a heat dissipation fan 300 in accordance with a third exemplary embodiment is provided. The differences between the heat dissipation fan 300 of the third embodiment and the heat dissipation fan 100 of the first embodiment are described below. A figure of a distal end 221b of each blade 22b is different. In the third embodiment, a middle portion of the distal end 221b of each blade 22b protrudes towards the groove 17 of the side wall 112 to form a rounded convex edge. Accordingly, a diameter of the middle portion of the blade 22b increases without increasing a distance between the top/bottom edge of the blade 22b and the side wall 112. As such, an air quantity driven by the blades 22b can be increased by increasing tangent speed of the distal end 221b of the blades 22b, without increasing a total size of the heat dissipation fan 300. Further, a variation of the air pressure can be reduced when each blade 22b passes through the protruding portion 16 under a cooperation of the rounded distal end 221b of each blade 22b and the concave curved groove 17. It can further reduce the noise of the blades 22b at the frequency doubling point and improve the heat dissipation efficiency of the heat dissipation fan 300.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A heat dissipation fan comprising:
a housing comprising a casing, the casing comprising a bottom wall and a side wall extending upwardly from the bottom wall and having an inner surface;
an impeller received in the housing, the impeller comprising a hub and a plurality of blades extending radially and outwardly from the hub, each blade having a free distal end adjacent the inner surface of the side wall of the casing;
wherein the inner surface of the side wall is directed outwardly towards an outer side of the casing, the inner surface is symmetrical with respect to a plane located in a middle of the side wall, and a distance between the plane and the bottom wall is half of a height of the side wall.

2. The heat dissipation fan of claim 1, wherein the side wall comprises a bottom edge adjoining the bottom wall of the casing and an upper edge away from the bottom edge, the inner surface of the side wall between the upper edge and the bottom edge is directed outwardly towards the outer side of the casing to form a groove.

3. The heat dissipation fan of claim 2, wherein the groove is concave curved.

4. The heat dissipation fan of claim 2, wherein a diameter of a middle portion between the upper edge and the bottom edge of the side wall is larger than that of the upper edge or the bottom edge of the side wall.

5. The heat dissipation fan of claim 1, wherein the side wall comprises a bottom edge adjoining the bottom wall of the casing, an upper edge away from the bottom edge and a middle portion between the bottom wall and the upper edge, the inner surface of the side wall is directed outwardly towards the outer side of the housing to define two grooves.

6. The heat dissipation fan of claim 1, wherein each of the two grooves is concave curved.

7. The heat dissipation fan of claim 1, wherein a vertical height of the blades is smaller than that of the side wall of the casing.

8. The heat dissipation fan of claim 7, wherein the distal end of each blade is perpendicular to the bottom wall of the casing.

9. The heat dissipation fan of claim 7, wherein a middle portion of the distal end of each blade protrudes towards the inner surface of the side wall to form a rounded convex edge.

10. The heat dissipation fan of claim 1 further comprising a top plate, wherein the top plate covers the casing at the upper edge of the side wall, and a receiving space is defined between the top plate and the casing for receiving the impeller.

11. The heat dissipation fan of claim 10, wherein an air inlet is defined in a central portion of the top plate and the bottom wall, and an air outlet with an opening direction perpendicularly to that of the air inlet is defined at a lateral side of the casing.

12. The heat dissipation fan of claim 11, wherein a protruding portion is formed on the side wall and adjacent to the air outlet, extending towards the receiving space.

13. A heat dissipation fan comprising:
a housing comprising a casing and a top plate covering the casing, the casing comprising a bottom wall and a side wall extending upwardly from the bottom wall and having an inner surface;
an impeller received in the housing, the impeller comprising a hub and a plurality of blades extending radially and outwardly from the hub, each blade having a free distal end adjacent the inner surface of the side wall of the casing;
wherein an air channel is defined by a space between the blades and the side wall of the casing spaced, and the air channel has an outer boundary protruding radially outwards from the hub of the impeller, the air channel is symmetrical with respect to a plane located in a middle of the side wall, and a distance between the plane and the bottom wall is half of a height of the side wall.

14. The heat dissipation fan of claim 13, wherein the distal end of each blade is perpendicular to the bottom wall of the casing.

15. The heat dissipation fan of claim 14, wherein the air channel is convex curved.

16. The heat dissipation fan of claim 14, wherein the air channel has an approximately wave-shaped outer boundary.

17. The heat dissipation fan of claim 13, wherein an inner surface of the side wall defines at least one groove corresponding to the air channel.

18. The heat dissipation fan of claim 14, wherein a middle portion of the distal end of each blade protrudes towards the at least one groove of the side wall to form a rounded convex edge.

19. The heat dissipation fan of claim 13, wherein a vertical height of the blades is smaller than that of the side wall of the casing.

* * * * *